(12) United States Patent
Ha (10) Patent No.: US 7,359,243 B2
(45) Date of Patent: Apr. 15, 2008

(54) MEMORY CELL REPAIR USING FUSE PROGRAMMING METHOD IN A FLASH MEMORY DEVICE

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/824,937

(22) Filed: Jul. 3, 2007

(65) Prior Publication Data

US 2007/0253252 A1 Nov. 1, 2007

Related U.S. Application Data

(63) Continuation of application No. 11/132,602, filed on May 19, 2005.

(51) Int. Cl.
G11C 16/06 (2006.01)
G11C 16/04 (2006.01)
G11C 7/00 (2006.01)

(52) U.S. Cl. .......................... 365/185.09; 365/185.17; 365/200

(58) Field of Classification Search ........... 365/185.09, 365/200
See application file for complete search history.

(56) References Cited

U.S. PATENT DOCUMENTS

| | | | |
|---|---|---|---|
| 5,574,684 A | 11/1996 | Tomoeda | |
| 6,031,760 A | 2/2000 | Sakui et al. | |
| 6,198,659 B1 | 3/2001 | Hirano | |
| 6,654,272 B2 | 11/2003 | Santin et al. | |
| 6,813,184 B2 | 11/2004 | Lee | |
| 6,845,029 B2 | 1/2005 | Santin et al. | |
| 7,173,862 B2 | 2/2007 | Futatsuyama et al. | |
| 2002/0012282 A1 | 1/2002 | Saito et al. | |
| 2002/0062473 A1 | 5/2002 | Tomioka | |
| 2002/0122331 A1 | 9/2002 | Santin et al. | |
| 2003/0074152 A1 | 4/2003 | Kessenich et al. | |
| 2004/0015674 A1 | 1/2004 | Lakhani et al. | |
| 2004/0095817 A1 | 5/2004 | Hosono et al. | |
| 2004/0165457 A1 | 8/2004 | Park et al. | |
| 2005/0146932 A1* | 7/2005 | Lee et al. | 365/185.05 |
| 2005/0162923 A1 | 7/2005 | Guterman et al. | |
| 2006/0023502 A1 | 2/2006 | Cernea et al. | |

* cited by examiner

*Primary Examiner*—Ly Duy Pham
(74) *Attorney, Agent, or Firm*—Leffert Jay & Polglaze, P.A.

(57) ABSTRACT

A method for repairing cells of a flash memory array includes using a fuse memory array circuit. The fuse memory cells are initially programmed. The locations of defective memory cells of the main array are determined. These locations are stored in the fuse memory cells by erasing predetermined locations in the fuse memory cell array so that the locations are programmed.

19 Claims, 6 Drawing Sheets

MEMORY CELL REPAIR USING FUSE PROGRAMMING METHOD IN A FLASH MEMORY DEVICE

RELATED APPLICATION

This Application is a Continuation of U.S. application Ser. No. 11/132,602 titled "MEMORY CELL REPAIR USING FUSE PROGRAMMING METHOD IN A FLASH MEMORY DEVICE", filed May 19, 2005, (allowed) which is commonly assigned and incorporated herein by reference.

TECHNICAL FIELD OF THE INVENTION

The present invention relates generally to memory devices and in particular the present invention relates to erasing flash memory devices memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding a charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

Flash memory devices typically use fuse elements for storing control, trimming, and/or operational status data. For example, memory lock bits might be stored in a mini-array of fuse elements to indicate when a block of flash memory is write protected.

A row of fuse elements in a mini-array share the same word line. Therefore, when a programming voltage is applied to a particular word line, all of the cells on that word line experience the same programming voltages. This can cause word line stress to the inhibited cells on the word line. The inhibited cells are experiencing a program disturb condition.

Additionally, if a programmed cell does not have a high enough programmed voltage, the cell will leak causing a stand-by current. Therefore, programmed cells must be programmed to raise their threshold voltage high enough to reduce the leakage. This strong of programming can be achieved by a high program gate voltage or by increasing the program time. Either method increases the program stress experienced by the other cells on the word line. In fact, the erased cells on the word line may even be slightly programmed due to the stress.

Figure 1:
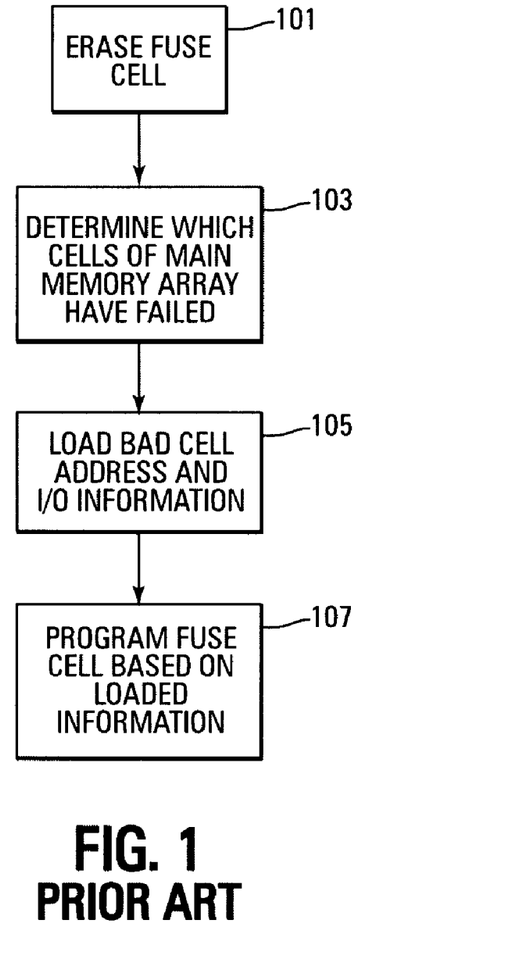
FIG. 1 shows a flowchart of a typical prior art repair method using fuse memory cells.

FIG. 1 illustrates a typical prior art fuse repair method to fix fuses that have experienced a word line stress condition. The method first erases the fuse memory cells 101 and then determines which cells in the main memory array have failed 103. The addresses of the failed bits are loaded into the fuse circuitry along with the I/O information 105. The fuse memory cells are then programmed with the loaded information 107.

Since the fuse cells are programmed during the manufacturing process, the optimum programming condition needs to be found during this time. This typically requires the test engineer to monitor each NAND string cell current after programming. The programming and monitoring is repeated until the current is low enough to indicate a programmed state.

One problem with this approach, however, is large amount of time required to complete the programming/monitoring step. When this time is multiplied over the large quantities of memory IC's that a manufacturer produces, it can greatly reduce the manufacturer's output, thereby increasing the cost of each part.

For the reasons stated above, and for other reasons stated below which will become apparent to those skilled in the art upon reading and understanding the present specification, there is a need in the art for a more efficient, less stressful fuse memory cell repair method.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
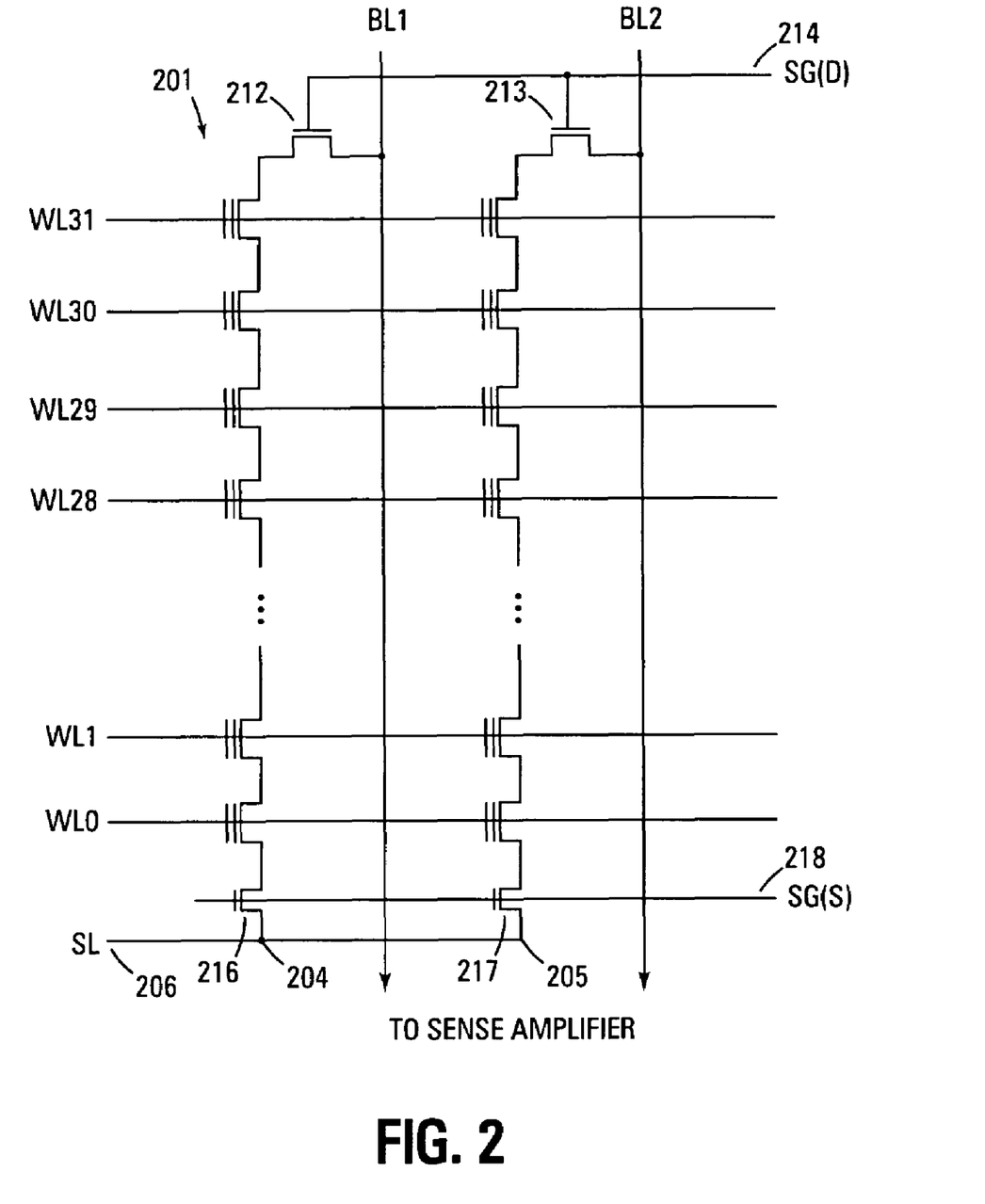
FIG. 2 shows a simplified diagram of a typical NAND flash memory array of the present invention.

FIG. 2 illustrates a simplified diagram of one embodiment for a main NAND flash memory array of the present invention. The memory array of FIG. 2, for purposes of clarity, does not show all of the elements typically required in a memory array. For example, only two bit lines are shown (BL1 and BL2) when the number of bit lines required actually depends upon the memory density. The bit lines are subsequently referred to as (BL1-BLN).

The array is comprised of an array of floating gate cells 201 arranged in series columns 204, 205. Each of the floating gate cells 201 are coupled drain to source in each series chain 204, 205. A word line (WL0-WL31) that spans across multiple series strings 204, 205 is coupled to the control gates of every floating gate cell in a row in order to control their operation. The bit lines (BL1-BLN) are eventually coupled to sense amplifiers (not shown) that detect the state of each cell.

In operation, the word lines (WL0-WL31) select the individual floating gate memory cells in the series chain 204, 205 to be written to or read from and operate the remaining floating gate memory cells in each series string 204, 205 in a pass through mode. Each series string 204, 205 of floating gate memory cells is coupled to a source line 206 by a source select gate 216, 217 and to an individual bit line (BL1-BLN) by a drain select gate 212, 213. The source select gates 216, 217 are controlled by a source select gate control line SG(S) 218 coupled to their control gates. The drain select gates 212, 213 are controlled by a drain select gate control line SG(D) 214.

Each cell can be programmed as a single bit per cell (i.e., single level cell—SLC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicates a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected word line for the flash memory cell to be programmed is biased with a series of incrementing voltage programming pulses that start at an initial voltage that is greater than a predetermined programming voltage (e.g., approximately 16V). After each programming pulse, a verification operation with a word line voltage of 0V is performed to determine if the cell's threshold voltage $V_t$ has increased to the properly programmed level (e.g., 0.5V).

The unselected word lines for the remaining cells are typically biased at a voltage that is less than the programming voltage (e.g., approximately 10V) during the program operation. In one embodiment, the unselected word line voltages can be any voltage above ground potential. Each of the memory cells is programmed in a substantially similar fashion.

A memory array of the present invention is broken down into memory blocks. The quantity of memory blocks is typically determined by the size of the memory device (i.e., 512 MB, 1 GB). Each memory block is comprised of 64 pages.

The array illustrated in FIG. 2 is for a NAND architecture array. The embodiments of the present invention, however, are not limited to any one type of array architecture. For example, the present invention may also operate properly in NOR or AND architecture arrays.

Figure 3:
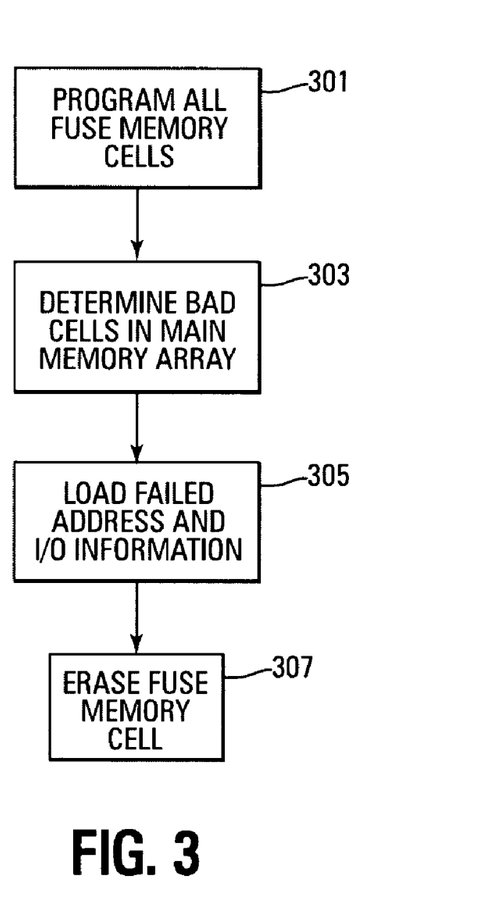
FIG. 3 shows a flowchart of one embodiment of a method of the present invention for an erase operation.

FIG. 3 illustrates a flowchart of one embodiment of the fuse memory repair operation of the present invention. The method initially programs all of the fuse memory cells in the fuse array 301. In one embodiment, the fuse array is part of a mini-array that is separate from the main flash memory array. Alternate embodiments fabricate the fuse memory cells in alternate locations of the memory device.

The bad memory cells of the main memory array, as illustrated in FIG. 2, are then determined 303. This can be accomplished using any method that is well known in the art. For example, data can be written to the main memory array to program each memory cell. A program verify operation is then performed to determine whether the cell has been programmed. If a particular cell is still not programmed after a predetermined number of program pulses, it is marked as bad.

The addresses of the bad memory cells and the location of the replacement, redundant cells are loaded into the fuse memory circuit 305 for storage. As is well known in the art, the locations of the bad memory cells is used by the memory device controller for future operation of the device. When a program/read/erase operation is received that includes the bad memory address, the memory controller reads the fuse circuits to determine where the replacement cells are located in order to write the data to those locations instead.

Using the loaded bad address data, the programmed fuse memory cells are then erased 307 leaving only those memory cells programmed that would have normally been programmed to store the bad address information if the fuse cells were initially erased. In other words, the bad address information is erased into the programmed fuse memory cells so that the fuse memory cells end up being programmed with the bad address information.

Figure 4:
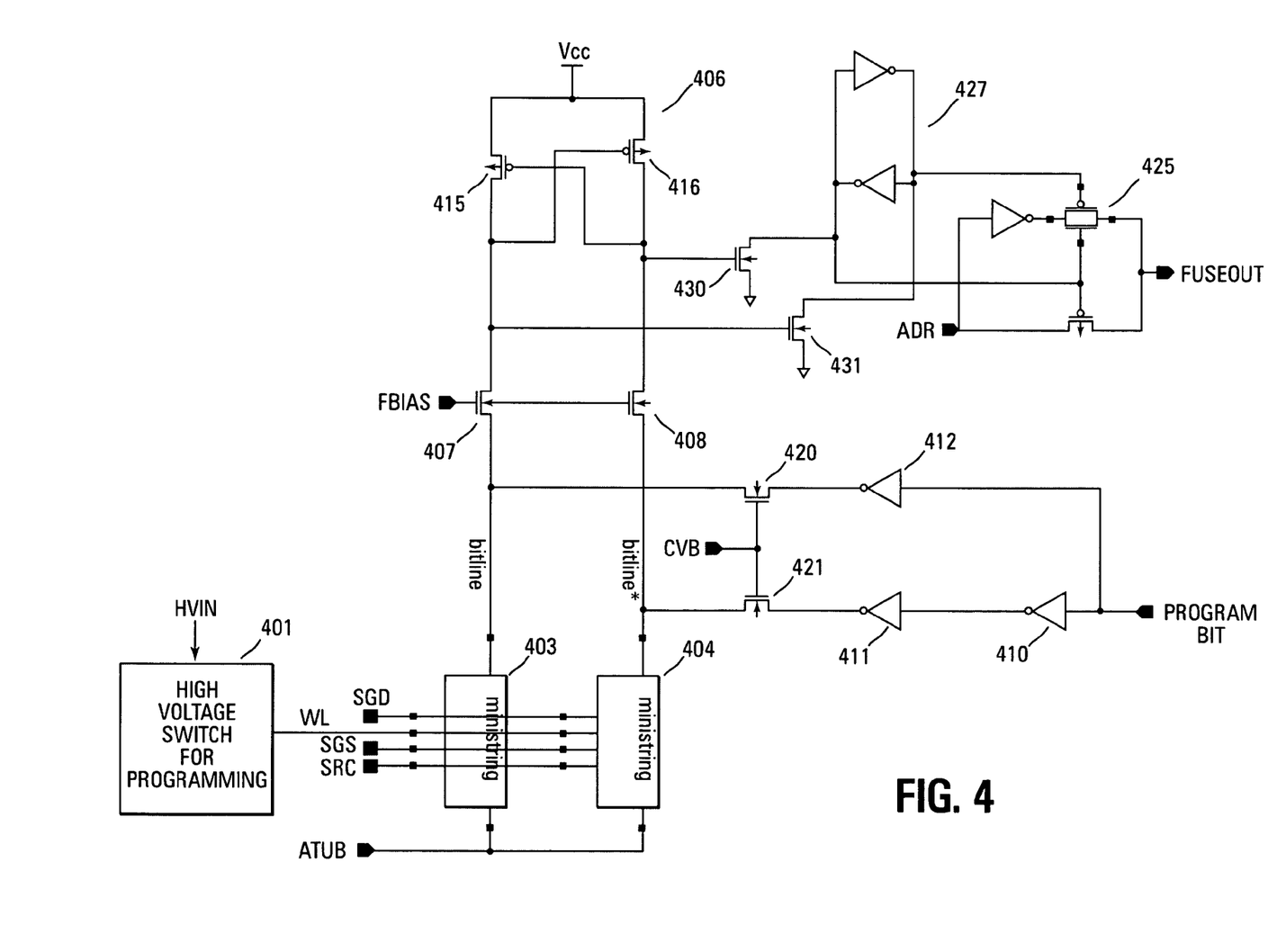
FIG. 4 shows a simplified schematic diagram of one embodiment for fuse memory cell circuitry of the present invention.

FIG. 4 illustrates a simplified schematic diagram of one embodiment for fuse memory cell circuitry of the present invention. The circuit is comprised of a high voltage switch 401 that supplies the high programming voltages for the word line WL going to the mini-strings 403, 404. One mini-string 403 is the complement of the other mini-string 404.

Figure 5:
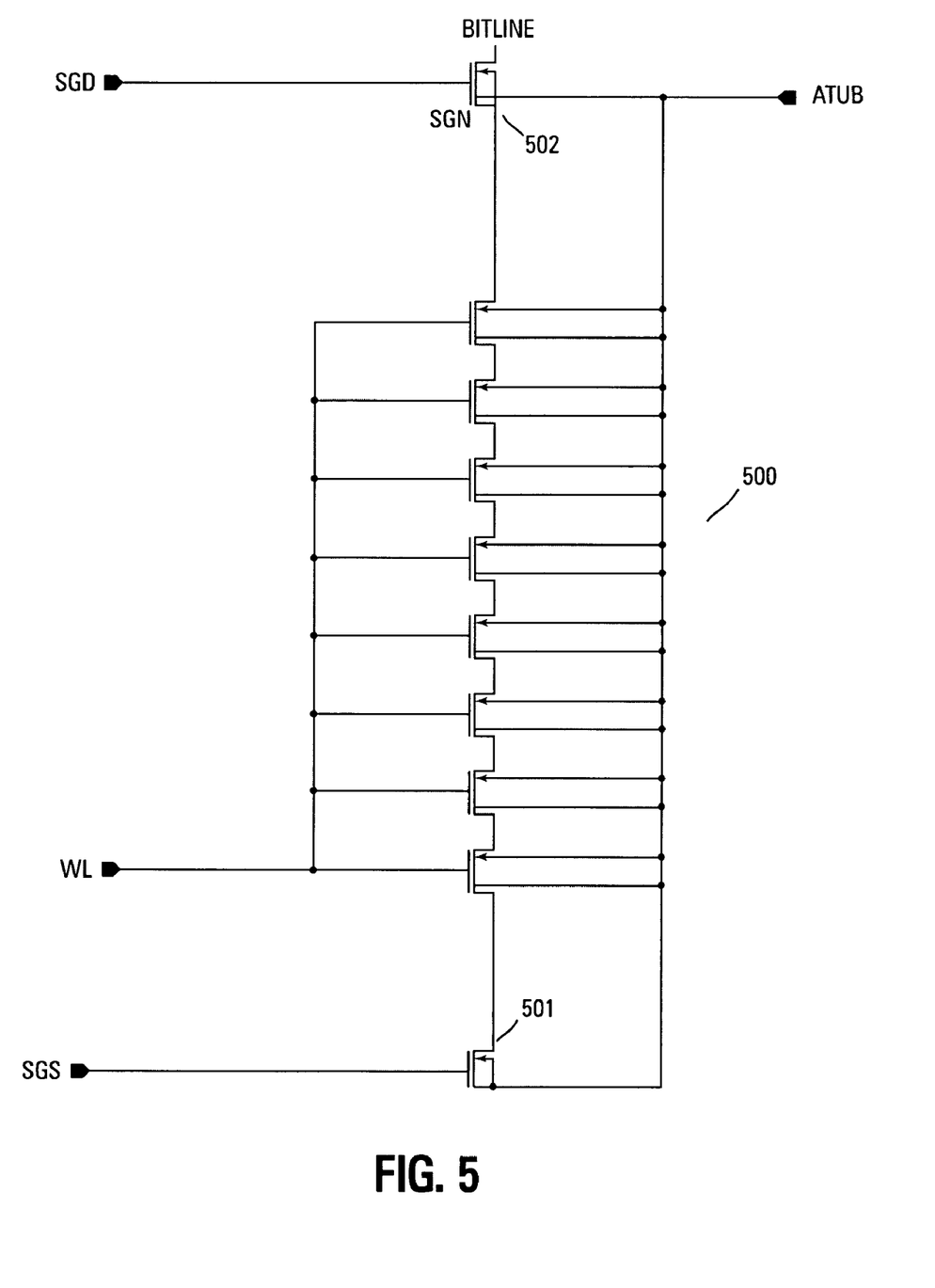
FIG. 5 shows a simplified schematic diagram of one embodiment for fuse memory cells in accordance with the embodiment of FIG. 4.

FIG. 5 illustrates a simplified schematic diagram of one embodiment for fuse memory cell mini-strings 403, 404 in accordance with the embodiment of FIG. 4. The mini-strings are comprised of a plurality of non-volatile memory cells 500 that are arranged in a serial string. The word line WL from the high voltage switch 401 of FIG. 4 is connected to each of the control gates of the memory cells 500. While being programmed, the word line WL has the same voltage biasing all of the memory cells 500. During an erase operation, the word line WL is left floating.

An ATUB input provides proper biasing to the substrates of each memory cell as required during a read, erase, or write operation. While erasing the fuse memory cells 500, each gate of those cells to remain programmed, during the storing of failed address data, is biased with an erasing tub bias voltage that is created by gate coupling from the ATUB bias to the tub of the cell.

Control transistors 501, 502 are on either side of the flash memory string 500. The top control transistor 502 is connected to the select gate drain SGD control line. The bottom control transistor 501 is connected to the select gate source SGS control line. A logical high on these lines, in one embodiment, turns on the control transistors 501, 502 so that the string can output data over the BITLINE output.

Referring again to FIG. 4, the programmed or erased state of the mini-strings 403, 404 affect the output of the BITLINE and BITLINE* signals. These signals, in turn, affect the state of the cross latch fuse sensing circuit 406, depending on the state of the FBIAS signal that turns on two transistors 407, 408. In one embodiment, FBIAS is tied to $V_{CC}$. Alternate embodiments can use other signals for FBIAS.

For example, one pull down circuit 415 will have a programmed bit cell while the other pull down circuit 416 has an erased bit cell. The state of the BITLINE and BITLINE* lines turns on or off the transistors 430, 431 that control the output FUSEOUT of the fuse circuitry. The output is latched into a latch circuit 427 before going through a transfer gate circuit 425 that is controlled by an input address line ADR. Each fuse has one address line ADR coming from a user input address. Therefore, the quantity of latch circuits 427 and transfer gate circuits 425 depends on the quantity of fuses required.

An input program bit, PROGRAM BIT, is input through control transistors 420, 421 and inverters 410-412 in order to be stored in the mini-strings 403, 404 during a fuse programming operation. The data bit goes through inverter 412 and control transistor 420 before being stored in its mini-string 403. The complement of the data bit goes through inverters 410, 411 and control transistor 421 before being stored in its mini-string 404.

The control signal CVB controls the transistors 420, 421 that allow or block input of data from PROGRAM BIT. The CVB signal is $V_{CC}$ while a fuse cell is being programmed and 0V otherwise.

Figure 6:
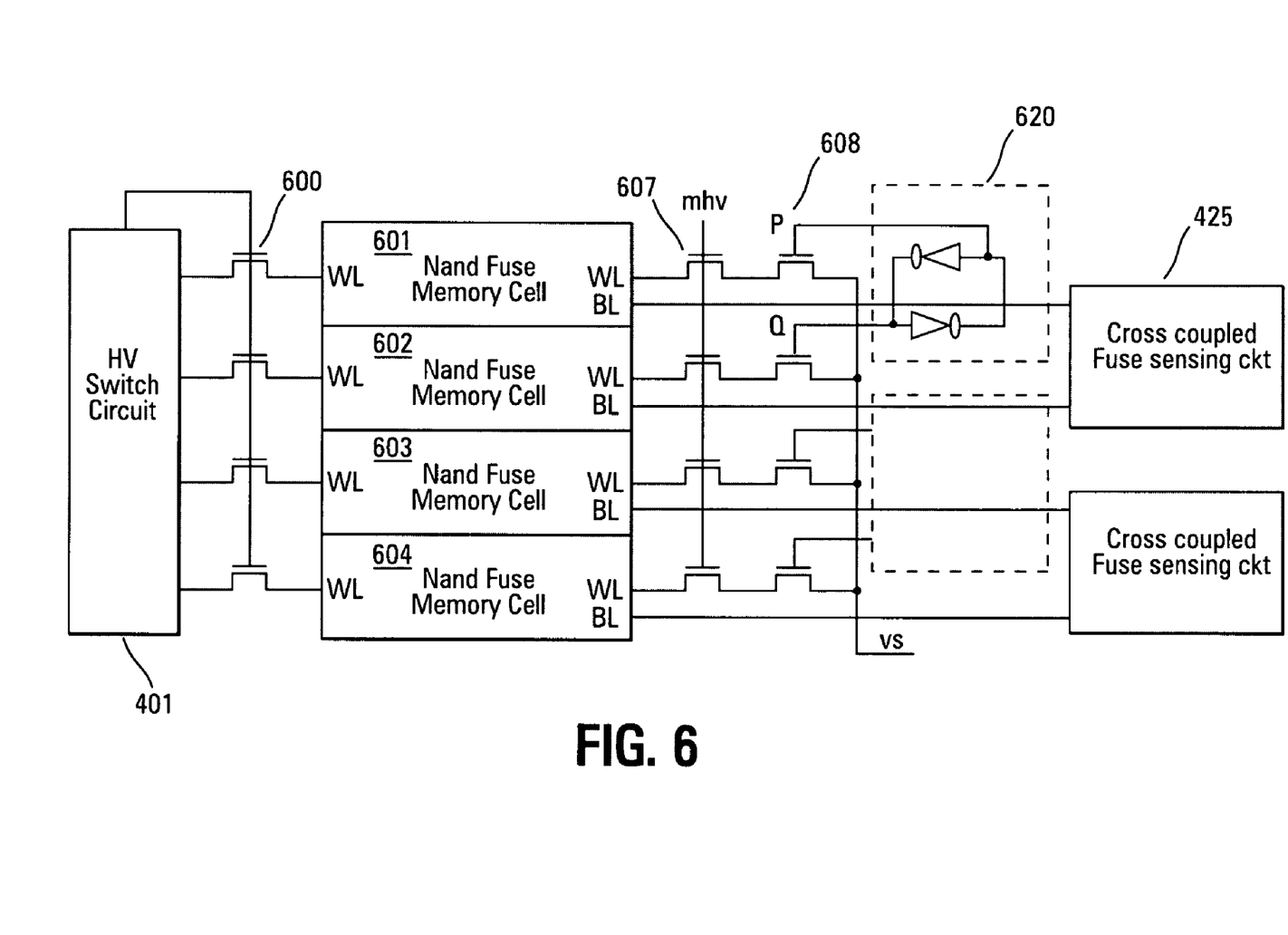
FIG. 6 shows a block diagram of one embodiment of the fuse memory cell circuit in accordance with FIGS. 3 and 4.

FIG. 6 illustrates a simplified block diagram of one embodiment of the fuse circuit of the present invention that incorporates the circuits of FIGS. 4 and 5. This figure shows the high voltage switch for programming 401 coupled through transistors 600 to the NAND fuse memory cells 601-604.

The word lines WL from the fuse cells 601-604 are coupled through two transistors 607, 608 to signal VS. VS is 0V during a fuse sensing operation and a fuse erasing operation and is $V_{CC}$ during a fuse programming operation. Alternate embodiments can use different voltages.

The latch circuit 620 is loaded with the information from the failed address and failed I/O as described with reference to the method of FIG. 3. This circuit then provides for a high P when Q is low and a low P when Q is high. If this node is high, the corresponding NAND fuse memory cell is erased since the word line is 0V. If this node is low, the corresponding NAND fuse memory cell is not erased since the word line is coupled to the tub voltage that could be approximately 20V in one embodiment.

The bit lines BL from the NAND fuse memory cells are coupled to the cross-coupled fuse sensing circuits 425. The details of this connection are illustrated in FIG. 4.

Figure 7:
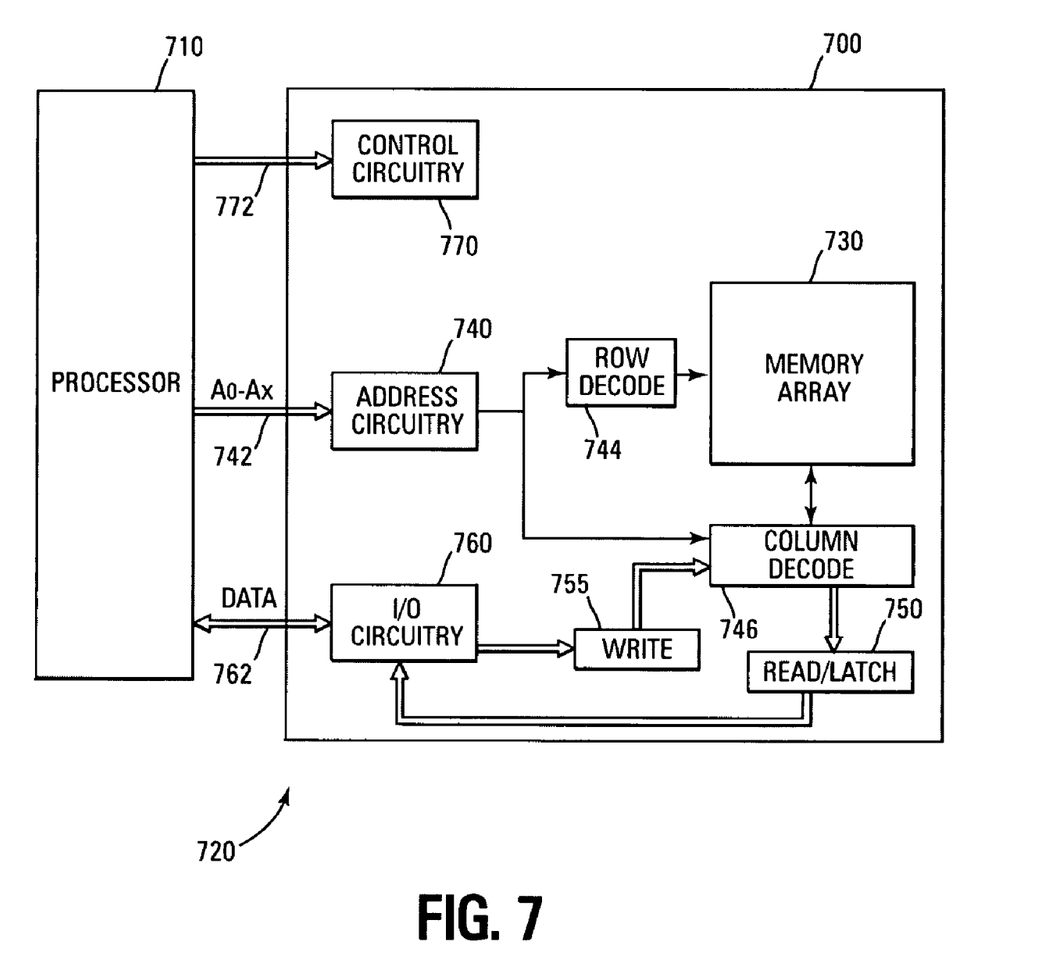
FIG. 7 shows a block diagram of one embodiment of an electronic system of the present invention.

FIG. 7 illustrates a functional block diagram of a memory device 700 of one embodiment of the present invention that is coupled to a processor 710. The processor 710 may be a microprocessor, a processor, or some other type of controlling circuitry. The memory device 700 and the processor 710 form part of an electronic system 720. The memory device 700 has been simplified to focus on features of the memory that are helpful in understanding the present invention.

The memory device includes an array of memory cells 730. In one embodiment, the memory cells are non-volatile floating-gate memory cells and the memory array 730 is arranged in banks of rows and columns.

An address buffer circuit 740 is provided to latch address signals provided on address input connections A0-Ax 742. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense/latch circuitry 750. The sense/latch circuitry, in one embodiment, is coupled to read and latch a row of data from the memory array 730. Data input and output buffer circuitry 760 is included for bi-directional data communication over a plurality of data connections 762 with the controller 710. Write circuitry 755 is provided to write data to the memory array.

Control circuitry 770 decodes signals provided on control connections 772 from the processor 710. These signals are used to control the operations on the memory array 730, including data read, data write, and erase operations. In one embodiment, the control circuitry 770 executes the embodiments of the flash memory array 730 repair method of the present invention. The control circuitry 770 may be a state machine, a sequencer, or some other type of controller.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, the embodiments of the present invention provide an improved method for repairing flash fuse memory cells. This method reduces or eliminates the program disturbance at the inhibited cells and potential stand-by current issues since all of the fuse memory cells can be strongly programmed at substantially the same time. The data is the erased into the fuse memory cells instead of being programmed at different times. Additionally, no current measuring is required, as in the prior art, which reduces the probe test time typically required during manufacture and testing.

The embodiments of the present invention are not limited to any one type of memory technology. For example, the circuits and methods of the present invention may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptions of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
   a first array of memory cells wherein each memory cell has an associated address location;
   a second array of memory cells comprising a plurality of fuse memory cells that includes a mini-string of memory cells and a complement mini-string of memory cells; and
   memory control circuitry adapted to program the second array of memory cells, perform a verification operation on the first array of memory cells, and erase into the second array of memory cells the address locations of defective memory cells identified during the verification operation.

2. The memory device of claim 1 wherein the memory control circuitry is a state machine.

3. A non-volatile memory device comprising:
   a main array of memory cells, each memory cell having an address location;

a mini-array of fuse memory cells comprising a mini-string of memory cells and a complement mini-string of memory cells; and memory cell repair circuitry that is adapted to program the mini-array of fuse memory cells, perform a verification operation on the main array of memory cells, and store addresses of defective memory cells identified during the verification operation wherein the addresses to be stored are erased into the programmed mini-array of fuse memory cells.

4. The memory device of claim 3 wherein the memory cells of the main array of memory are flash memory cells.

5. The memory device of claim 4 wherein the memory cells of the main array of flash memory cells are arranged in a NAND configuration.

6. The memory device of claim 4 wherein the memory cells of the main array of flash memory cells are arranged in a NOR configuration.

7. The memory device of claim 3 wherein the memory cell repair circuitry is further adapted to erase addresses into the programmed mini-array of fuse memory cells of memory cells assigned as replacement memory cells for memory cells identified as defective during the verification operation.

8. The memory device of claim 7 wherein the memory device is adapted to receive memory device control commands.

9. The memory device of claim 8 wherein the memory cell repair circuitry is further adapted to write data to a replacement memory cell in response to receiving a command to write data to a defective memory cell of the main array of memory cells.

10. The memory device of claim 3 wherein the mini-array of fuse memory cells is fabricated in alternate locations in the memory device.

11. The memory device of claim 3 wherein the mini-array of fuse memory cells comprises a mini-string of memory cells and a complement mini-string of memory cells.

12. A method for storing address locations of defective memory cells of an array of memory cells, the method comprising:

programming an array of fuse memory cells which are separate from a main array of memory cells and comprise a mini-string of memory cells and a complement mini-string of memory cells;

performing a verification operation on the main array of memory cells; and erasing into the array of programmed fuse memory cells the address locations of main array memory cells identified as defective during the verification operation.

13. The method of claim 12 wherein the verification operation comprises performing a programming operation on the memory cells of the main array of memory cells.

14. The method of claim 13 wherein the verification operation is repeated in response to a failure of the verification operation.

15. The method of claim 14 wherein a memory cell of the main array of memory cells is marked as defective if the cell has not passed the verification operation after a predetermined number of repeated programming attempts.

16. The method of claim 12 further comprising performing a threshold voltage verification operation on the fuse memory cells after programming to determine if the threshold voltages of the fuse memory cells have increased to at least a programmed threshold voltage.

17. The method of claim 12 further comprising erasing into the array of programmed fuse memory cells the address locations of replacement memory cells corresponding to defective main array memory cells identified during the verification operation.

18. The method of claim 17 further comprising writing data to a replacement memory address location corresponding to a defective memory address location in response to a command to write data to the defective memory address location.

19. An electronic system comprising:

a processor for generating memory control signals; and a non-volatile memory device, coupled to the processor and adapted to receive the memory control signals, the memory device comprising:

a main array of memory cells, each memory cell having an address location;

a mini-array of fuse memory cells comprsing a mini-string of memory cells and a complement mini-string of memory cells; and memory cell repair circuitry adapted to program the mini-array of fuse memory cells, perform a verification operation on the main array of memory cells, and store the addresses of defective memory cells identified during the verification operation wherein the addresses to be stored are erased into the programmed mini-array of fuse memory cells.

* * * * *

UNITED STATES PATENT AND TRADEMARK OFFICE
CERTIFICATE OF CORRECTION

PATENT NO. : 7,359,243 B2
APPLICATION NO. : 11/824937
DATED : April 15, 2008
INVENTOR(S) : Ha It is certified that error appears in the above-identified patent and that said Letters Patent is hereby corrected as shown below:

On the Title page, in field (54), in "Title", in column 1, line 2, after "IN A" delete "FLASH".

In column 1, line 2, after "IN A" delete "FLASH".

In column 8, line 37, in Claim 19, delete "comprsing" and insert -- comprising --, therefor.

Signed and Sealed this

First Day of July, 2008

JON W. DUDAS
*Director of the United States Patent and Trademark Office*